United States Patent [19]
Eastham et al.

[11] Patent Number: 5,209,578
[45] Date of Patent: May 11, 1993

[54] BEARINGS HAVING AN OVERLAY COATING CONTAINING DISPERSED PHASE OF A SECOND MATERIAL

[75] Inventors: David R. Eastham, Hemel Hempstead; Alan D. Pope, Rugby, both of England

[73] Assignee: T & N Technology Limited, Rugby, England

[21] Appl. No.: 640,365

[22] PCT Filed: Jun. 18, 1990

[86] PCT No.: PCT/EP90/00970
§ 371 Date: Jan. 30, 1991
§ 102(e) Date: Jan. 30, 1991

[87] PCT Pub. No.: WO91/00375
PCT Pub. Date: Jan. 10, 1991

[30] Foreign Application Priority Data
Jul. 3, 1989 [GB] United Kingdom ............ 8915254.0

[51] Int. Cl.$^5$ ..................... F16C 33/12; F16C 33/24
[52] U.S. Cl. ....................................... 384/276; 384/912
[58] Field of Search ................ 384/276, 294, 912, 913

[56] References Cited
U.S. PATENT DOCUMENTS

| | | | |
|---|---|---|---|
| 4,069,369 | 1/1978 | Fedor et al. | 384/276 X |
| 4,582,368 | 4/1986 | Fujita et al. | 384/912 X |
| 4,608,085 | 8/1986 | Eudier et al. | 384/912 X |
| 4,645,360 | 2/1987 | Eastwood et al. | 384/912 X |
| 4,900,639 | 2/1990 | Hodes et al. | 384/912 X |
| 4,916,026 | 4/1990 | Bergmann et al. | 384/912 |
| 4,973,523 | 11/1990 | Neuhaus et al. | 384/912 X |
| 4,996,025 | 2/1991 | Pratt et al. | 384/276 X |

FOREIGN PATENT DOCUMENTS 300993 1/1989 European Pat. Off. .
2130250 5/1984 United Kingdom .

*Primary Examiner*—Thomas R. Hannon
*Attorney, Agent, or Firm*—William R. Hinds

[57] ABSTRACT

Bearings having an overlay (14) deposited by cathodic sputtering. In one example the overlay comprises an aluminum matrix (22) containing a dispersed phase (24) of tin. The overlay may contain a relatively low content of tin adjacent the interface (18) with the substrate (10;12) rising to a relatively high content at the surface. The surface may comprise a layer (26) of substantially pure tin to act as a sacrificial overlay during initial running of the bearing.

12 Claims, 3 Drawing Sheets

BEARINGS HAVING AN OVERLAY COATING CONTAINING DISPERSED PHASE OF A SECOND MATERIAL

The present invention relates to journal bearings and to coatings known as overlays deposited on such bearings particularly by the technique of cathodic sputtering.

It is known to deposit soft overlay alloy compositions onto the running surface of a journal bearing by cathodic sputtering. An example of this is described in European patent application 0 300 993 of Koroschetz et al. An overlay based on copper, aluminium or silver is described having columnar crystal grains with a major axis normal to the sliding direction and an embedded phase of particles which are softer than the matrix and also insoluble in the matrix metal. Examples are given of overlay compositions of aluminium-20 vol. % tin and copper-30 vol. % lead. Such alloy compositions were, until relatively recently used as wrought or cast materials as the main bearing material having an overlay running coating based on alloys of lead or tin. The use of such two-phase alloys as the overlay is attributable to the search for materials having both improved wear resistance and improved fatigue strength over conventional electro-deposited lead and tin based alloys whilst retaining good comformability and anti-seizure properties.

However, in the initial stages of running of a new shaft in an engine it is desirable to have a higher degree of conformability than is readily provided from known two-phase alloys such as are described in EP 0 300 993. Furthermore, as the overlay wears and the running clearance between shaft journal and bearing increases it is desirable to provide an increasing degree of wear resistance in the overlay material. With increasing overlay wear, conformability becomes less important and wear resistance becomes more important.

According to the present invention there is provided a journal bearing including a strong backing material having thereon a relatively thick layer of a bearing material, and having a relatively thin overlay coating, the overlay coating comprising a first material constituting the coating matrix and having therein a dispersed phase of a second material wherein the dispersed phase of the second material has a relatively low content adjacent the bearing material layer and has a relatively high content at the coating surface, the total thickness of said overlay coating being in the range from 10 to 50 micrometers.

The bearing material, interposed between the strong backing material which may, for example, be steel, and the coating may be a copper based alloy such as a leaded-bronze, an aluminium alloy such as an aluminium-copper-silicon-tin alloy or a silver alloy.

Where diffusion between the dispersed phase in the coating may occur into the bearing material at the bearing operating temperature, it is desirable for the coating at the interface to consist essentially of the matrix metal without dispersed second material therein. The thickness of the coating matrix material at the interface may be less than 3 micrometers and preferably be between 0.1 and 2 micrometers to serve as a diffusion barrier.

In some instances where there is a layer of a bearing material it may be desirable to provide a coating of a further material of, for example, nickel or cobalt prior to deposition of the overlay itself. This further material may be deposited by electro-plating or by sputtering.

The use of a relatively pure interlayer is also beneficial in that it enhances adhesion to the substrate on which the coating is deposited.

The total thickness of the coating may be between 10 and 50 micrometers and preferably between 15 and 40 micrometers depending upon the application.

At the running surface of the coating there may be a layer comprising virtually the pure second material to provide what is known as a sacrificial overlay. The thickness of this surface layer may be between 0.1 and 5 micrometers and preferrably be between 1 and 3 micrometers.

The purpose of the surface layer is to provide a high degree of conformability and compatibility in the initial running-in stage of an engine. The second material, constituting the dispersed phase and the surface layer, may be selected from materials known to have desirable bearing properties and which include, for example, lead, tin, cadmium, antimony, bismuth, indium, and alloys of these metals.

The surface layer may comprise a composition which is different from that of the dispersed phase throughout the remainder of the coating matrix. For example, where the dispersed phase in the coating comprises lead, the sacrificial surface layer may be lead alloyed with indium or tin to provide enhanced corrosion resistance.

The coating matrix may comprise aluminium, copper or silver and, in some instances, alloys based on these metals such as aluminium-silicon-copper, for example.

Where, for example, the coating comprises an aluminium matrix material having a tin phase dispersed therein, the coating being deposited on a leaded-bronze alloy, it may comprise a virtually pure aluminium interlayer of approximately 2 micrometers at the interface, then have a composition adjacent this interlayer of approximately aluminium-10 wt % tin rising to approximately aluminium-50 wt % tin and a total thickness of approximately 22 micrometers and have a sacrificial surface layer of approximately 3 micrometers of essentially pure tin.

Preferably, the micro structure of the coating generally comprises equiaxed grains.

The overlay coating may be deposited by cathodic sputtering as this is a convenient method of controlling the coating composition at any instant and is also amenable to automatic programmed control by known techniques such that a pure matrix metal interlayer, a continuously varying overlay composition and a pure second material surface layer may be deposited in a single operation.

In order that the present invention may be more fully understood, examples will now be described by way of illustration only with reference to the accompanying drawings, of which:

Figure 1:
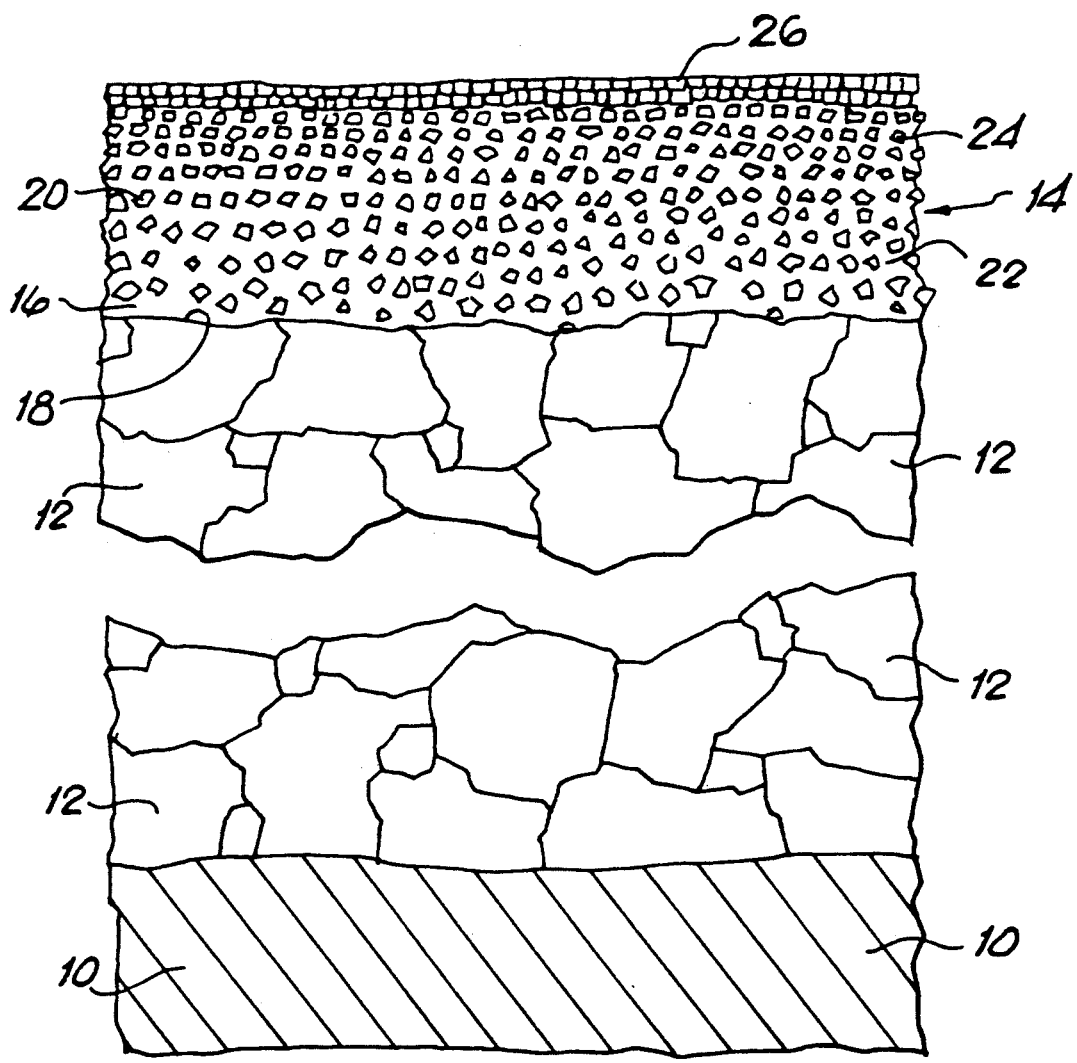
FIG. 1 shows a schematic representation of a section through an overlay coated bearing according to the present invention.

Referring now to FIG. 1 where a section through part of a bearing is shown and which comprises a steel backing 10, a layer 12 of a leaded bronze and a coating 14 according to the present invention. The coating 14 comprises an aluminium-tin composite material having a first layer 16, adjacent the interface 18 with the leaded bronze layer 12 of substantially pure aluminium and a thickness of approximately 2 micrometers. Adjacent the layer 16 is an intermediate layer 20 having an aluminium matrix 22 with dispersed particles 24 of tin therein. The intermediate layer has a composition of approximately aluminium-10 wt % tin adjacent the layer 16 and rising steadily in tin content to approximately 50-wt % at a thickness of approximately 22 micrometers. The coating 14 has, as a surface layer 26, a layer of substantially pure tin approximately 2 micrometers thick.

Figure 2:
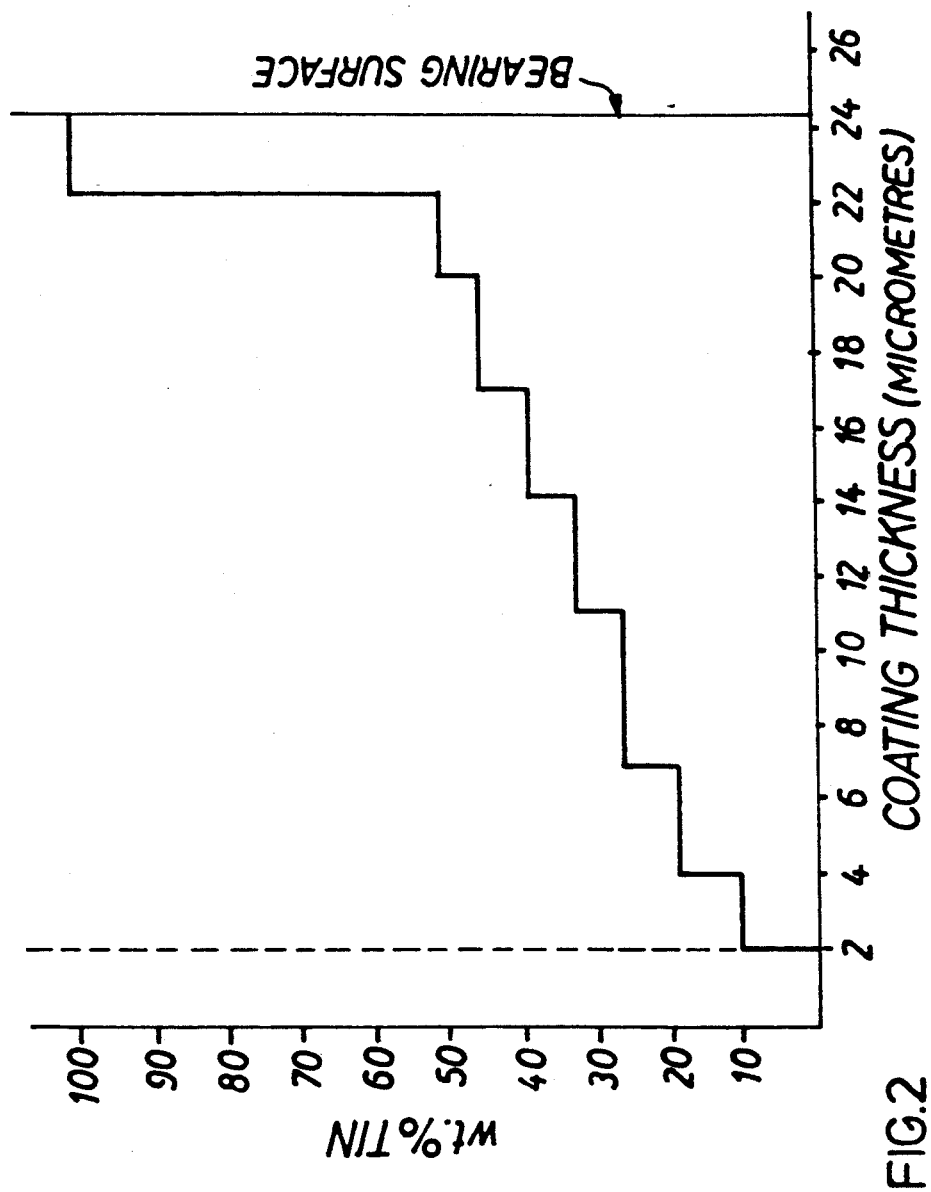
FIG. 2 shows a generalised graphical representation of the variation of overlay composition in the embodiment shown in FIG. 1.

The coating composition of FIG. 1 may be seen idealistically represented in FIG. 2. The 'stepped' incremental nature of the tin content variation results from the manual controls used with the sputtering apparatus. In practice a more even variation in tin content is achieved as changes in the control parameters do not result in instantaneous compositional changes.

Figure 3:
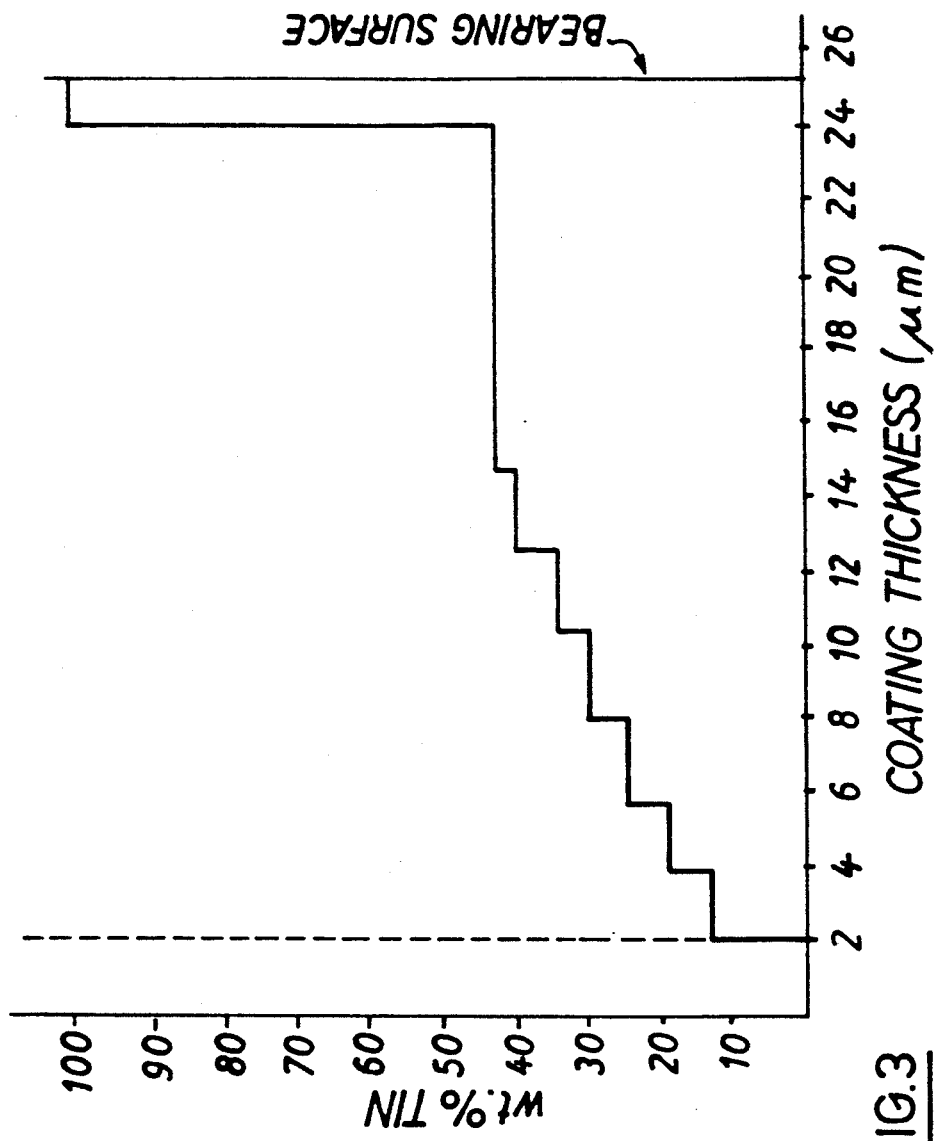
FIG. 3 which shows a graphical representation of an alternative embodiment of an overlay according to the present invention.

FIG. 3 shows a different distribution of tin through the thickness of the coating where a level of approximately 40 wt % tin is maintained through approximately half the thickness of the intermediate layer 20. By the technique of cathodic sputtering, overlays may be tailored to specific engine requirements with regard to composition and structure.

The coating of FIGS. 1 and 2 was produced by the following method.

Three targets, two of aluminium and one of tin were placed into the chamber of a cathodic sputtering apparatus. The chamber was pumped down to $6.75 \times 10^{-6}$ torr pressure followed by a rise to 8 millitorr by the introduction of pure argon. The steel backed leaded-bronze bearings were placed in a rotatable support jig maintained at 70° C. for sputter cleaning during which the bearing surface temperature is around 150° C. A DC bias of 3000 volts was applied to the bearing support jig and produced a current of 500 mA, sputter cleaning being carried out for a period of 15 minutes with the support jig rotating at 1 rpm. During sputter cleaning of the bearings all target shutters were closed. After 10 minutes of sputter cleaning two aluminium targets were initiated by running at 440 volts and 17.5 amps each to give a total power input of 15.4 kW. After 5 minutes the bias to the support jig was reduced to 500 volts, the aluminium target shutters were opened and a pure aluminium layer was deposited on the bearing surface to a thickness of 2 micrometers over a period of 5 minutes. At the start of the pure aluminium deposition, the single tin target was initiated to 490 volts at 4.5 amps to give a power input of 2.2 kW. The tin target was thus cleaned with its shutter closed. The power to the tin target was then reduced to 0.2 kW at 425 volts and 0.47 amps, the tin target shutter was then opened. The support jig bias was reduced to 100 volts for the remaining deposition time. With the carrier continuing to rotate, the power to each target was adjusted at 5 minute intervals to produce the stepped tin content characteristic shown in FIG. 2. Eventually when the intermediate layer was completed the shutters to the aluminium target were closed and the power to them shut off for the remaining deposition time of the surface layer of tin.

The overlay composition shown in FIG. 2 has a relatively uniform rate of change of tin content through the thickness between 2 and 22 micrometers whereas the overlay shown in FIG. 3 maintains a constant composition between about 15 and 24 micrometers. Thus by the use of cathodic sputtering overlay composition and structure may be "tailored" to the specific characteristics demonstrated by a particular engine type.

Fatigue strength of overlays as shown in the Figures have been measured on a known "Sapphire" fatigue and wear testing machine. Overlays deposited by sputtering have shown an average strength of 107 MPa which would indicate a range of strengths, some as high as 130 MPa at 3$\sigma$ limits. It should also be borne in mind that the maximum loading capacity of the "Sapphire" machine is 117 MPa and that a number of test samples had not fatigued at this load. Therefore, the actual average strength may be significantly in excess of 107 MPa. For the purpose of comparison, conventional electroplated lead-based overlay compositions have a typical average strength of about 61 MPa, at about 25 micrometers thickness, and show a maximum fatigue strength of about 87 MPa. The overlays of the present invention, therefore, show considerable performance advantages over conventional electroplated alloys based on lead.

Measurement of wear resistance on a "Sapphire" test machine shows that the sputtered layer has up to almost twice the wear resistance of an electroplated overlay based on lead. Thus, after an initial running in period of an accelerated wear test the rate of volume loss in mm$^3$/hour was:

| Lead Indium 7 | −0.012 |
| Lead Tin 10 | −0.009 |
| Lead Tin 10 Copper 2 | −0.007 |
| Aluminium - Tin 40 | −0.005 |

Testing in a large turbocharged diesel engine has shown overlays of the present invention to be much less prone to cavitation erosion than electroplated, lead-based overlays.

We claim:

1. A journal bearing including a strong backing material having thereon a relatively thick layer of a bearing material, and having a relatively thin overlay coating, the overlay coating comprising a first material constituting the coating matrix and having therein a dispersed phase of a second material wherein the dispersed phase of the second material has a relatively low content adjacent the bearing material layer and has a relatively high content at the coating surface, the total thickness of said overlay coating being in the range from 10 to 50 micrometers.

2. A bearing according to claim 1 wherein said bearing material layer is selected from the group consisting of copper alloys, aluminium alloys and silver alloys.

3. A bearing according to claim 1 wherein said overlay coating adjacent the bearing material layer comprises substantially pure matrix material for a thickness of up to 3 micrometers.

4. A bearing according to claim 3 wherein the thickness of the substantially pure matrix material layer lies in the range from 0.1 to 2 micrometers.

5. A bearing according to claim 1 wherein the total thickness of said overlay coating lies in the range from 15 to 40 micrometers.

6. A bearing according to claim 1 wherein the overlay coating surface comprises substantially pure second material for a thickness of up to 5 micrometers.

7. A bearing according to claim 6 wherein the overlay coating surface comprises substantially pure second material for a thickness lying in the range between 1 and 3 micrometers.

8. A bearing according to claim 1 wherein said second material of the overlay coating is selected from the group consisting of lead, tin, cadmium, antimony, bismuth, indium and alloys thereof.

9. A bearing according to claim 1 wherein said overlay coating matrix is selected from the group consisting of aluminium, copper, silver, aluminium alloys, copper alloys and silver alloys.

10. A bearing according to claim 1 wherein said overlay coating is deposited by cathodic sputtering.

11. A bearing according to claim 1 wherein said overlay coating comprises an aluminium matrix having a dispersed second phase of tin.

12. A bearing according to claim 11 wherein the composition of the overlay coating adjacent the bearing material layer is approximately aluminium −10 wt % tin whilst the composition adjacent the overlay coating surface is approximately aluminium −50 wt % tin.

* * * * *